United States Patent
Li et al.

(10) Patent No.: US 11,877,524 B2
(45) Date of Patent: Jan. 16, 2024

(54) NANOTIP FILAMENT CONFINEMENT

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Dexin Kong, Redmond, WA (US); Zheng Xu, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 316 days.

(21) Appl. No.: 17/469,203

(22) Filed: Sep. 8, 2021

(65) Prior Publication Data

US 2023/0074224 A1    Mar. 9, 2023

(51) Int. Cl.
*H10N 70/00*    (2023.01)

(52) U.S. Cl.
CPC ......... *H10N 70/063* (2023.02); *H10N 70/826* (2023.02); *H10N 70/8833* (2023.02); *H10N 70/021* (2023.02)

(58) Field of Classification Search
CPC ....................................................... H10N 70/00
See application file for complete search history.

(56) References Cited

U.S. PATENT DOCUMENTS

| | | | |
|---|---|---|---|
| 8,129,250 B2 | 3/2012 | Rossel et al. | |
| 8,853,713 B2 | 10/2014 | Marsh et al. | |
| 9,059,391 B2 | 6/2015 | Hou et al. | |
| 9,805,793 B2 | 10/2017 | Rajamohanan et al. | |
| 9,847,480 B2 | 12/2017 | Tu | |
| 9,911,790 B1 | 3/2018 | Shimabukuro | |
| 10,361,368 B2 | 7/2019 | Ando et al. | |
| 10,490,745 B2 | 11/2019 | Sun et al. | |
| 2015/0255594 A1 | 9/2015 | Zhu | |

FOREIGN PATENT DOCUMENTS

| | | |
|---|---|---|
| WO | 2016204420 A1 | 12/2016 |
| WO | 2020251637 A1 | 12/2020 |

OTHER PUBLICATIONS

Hong, Xiaoliang, et al. "Oxide-based RRAM materials for neuromorphic computing. Journal of materials science", Jun. 2018, pp. 8720-8746.
Wong, H.-S. Philip, et al. "Metal oxide RRAM", Proceedings of the IEEE. May 2, 2012, pp. 1951-1970.
International Search Reported issued in corresponding PCT APplication Serial No. PCT/EP2022/070520 dated Nov. 24, 2022.

*Primary Examiner* — Marvin Payen
(74) *Attorney, Agent, or Firm* — Tutunjian & Bitetto, P.C.; Samuel Waldbaum (57) ABSTRACT

Methods of forming a settable resistance device, settable resistance devices, and neuromorphic computing devices include isotropically etching a stack of layers, the stack of layers having an insulator layer in contact with a conductor layer, to selectively form divots in exposed sidewalls of the conductor layer. The stack of layers is isotropically etched to selectively form divots in exposed sidewalls of the insulator layer, thereby forming a tip at an interface between the insulator layer and the conductor layer. A dielectric layer is formed over the stack of layers to cover the tip. An electrode is formed over the dielectric layer, such that the dielectric layer is between the electrode and the tip.

20 Claims, 8 Drawing Sheets

NANOTIP FILAMENT CONFINEMENT

BACKGROUND

The present invention generally relates to semiconductor device manufacturing, and, more particularly, to the fabrication of resistive random access memory (RRAM) cells.

RRAM is a type of memory that encodes information in the resistive state of an RRAM cell. For example, the RRAM cell may have various different physical states that it can occupy, each with a different resistance. The value stored in the RRAM cell can be read by applying a voltage to the RRAM cell and measuring a resulting current. A resistance of the RRAM cell can then be determined from the measured current.

SUMMARY

A method of forming a settable resistance device includes isotropically etching a stack of layers, the stack of layers having an insulator layer in contact with a conductor layer, to selectively form divots in exposed sidewalls of the conductor layer. The stack of layers is isotropically etched to selectively form divots in exposed sidewalls of the insulator layer, thereby forming a tip at an interface between the insulator layer and the conductor layer. A dielectric layer is formed over the stack of layers to cover the tip. An electrode is formed over the dielectric layer, such that the dielectric layer is between the electrode and the tip.

A settable resistance cell includes a stack of layers that includes an insulator layer in contact with a conductor layer, each having concave sidewall surfaces that meet at an interface between the insulator layer and the conductor layer to form a tip to focus electrical field strength. A dielectric layer is formed over the stack of layers that covers the tip. An electrode is formed over the dielectric layer, such that the dielectric layer is positioned between the electrode and the tip.

A neuromorphic computing device includes an array of settable resistance cells. Each settable resistance cell includes a stack of layers that includes an insulator layer in contact with a conductor layer, each having concave sidewall surfaces that meet at an interface between the insulator layer and the conductor layer to form a tip to focus electrical field strength, a dielectric layer formed over the stack of layers that covers the tip, and an electrode formed over the dielectric layer, such that the dielectric layer is positioned between the electrode and the tip.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Resistive random access memory (RRAM) cells may be formed using a memristor element, for example formed from a hafnium oxide. During operation, a defect may be formed in the dielectric material that can be programmed to different resistive states, which may correspond to different logic states. For example, a low-resistance state may equate to a logical '1', while a high-resistance state may equate to a logical '0'. Thus, a RRAM cell may have a settable resistance. A change between these states may be triggered electrically, for example by changing the polarity of an electrical field across the memristor element. Such RRAM cells can be used for classic memory applications, as well as in neuromorphic computing applications, where a resistive memory cell may be used to perform computations in neural network models.

One way to implement a memristor element uses a hafnium oxide dielectric layer. Conductive filaments may form in hafnium oxide under an appropriate electrical field, which provide a conductive path through the dielectric layer. However, the formation of such filaments can be random, with edge effects becoming more obvious due to etching damage as the cell size scales down. To help localize the formation of such filaments, tipped structures may be formed that help to focus the electric field. The control voltage may then be reduced, and the likelihood of forming filaments is increased relative to the likelihood of forming filaments at less useful positions. Thus, filaments may form preferentially at the tipped structures. As to the voltage, RRAM cells that do not include tips to enhance field strength may operate at voltages between about 1V and about 3V, whereas RRAM cells that do include such tipped structures may operate at significantly lower voltages. In one illustrative example, RRAM cells with tipped structures may operate at about 0.5V or less.

During operation, the filament may be formed from a redox operation, within the dielectric layer. Mechanisms responsible for this include the electrochemical metallization effect (ECM) and the valence change memory effect (VCM). In ECM, the conductive path of the switching layer may be formed by metal cations of an electrochemically active electrode under an electric field. For VCM, migration of anions (e.g., oxygen vacancies) contributes to the formation of a conductive path within the oxide layer. VCM may use an oxygen scavenging layer to facilitate anionic movement between the electrodes.

Figure 1:
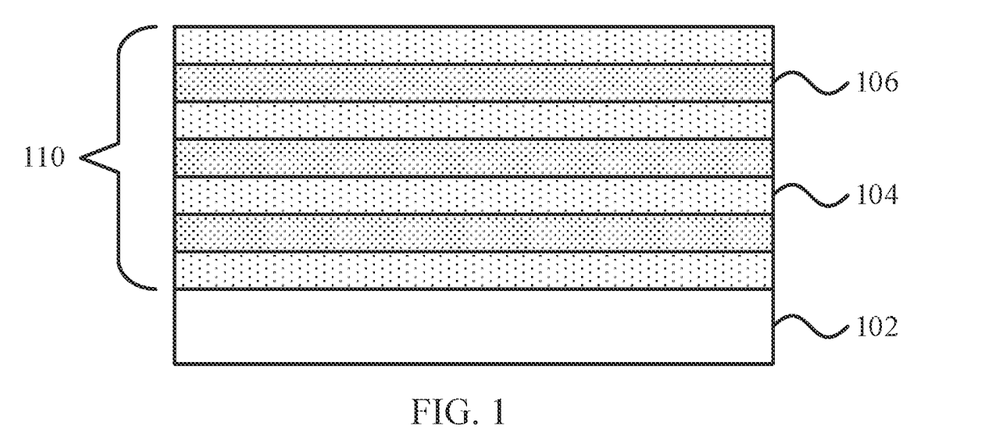
FIG. 1 is a cross-sectional view of a step in the formation of a device having a settable resistance, showing a stack of alternating insulator layers and conductor layers, in accordance with an embodiment of the present invention.

Referring now to FIG. 1, a cross-sectional view of a step in the formation of an RRAM cell is shown. A stack of layers 110 is formed on a substrate 102. The stack 110 may include alternating dielectric layers 104 and conductor layers 106, with a lowest dielectric layer 104 being positioned below a lowest conductor layer 106 to prevent leakage currents between the conductor layer 106 and the substrate 102. Although seven layers are shown in the stack 110 for simplicity of illustration, it should be understood that any appropriate number of layers may be used. For example, structures formed in processes designed around NAND memory may have hundreds of layers.

The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the substrate 102 may also be a semiconductor on insulator (SOI) substrate.

Additionally, the substrate 102 may be a device layer that may include a variety of different components, including active devices such as transistors, passive electrical devices such as resistors, capacitors, or inductors, interconnects such as conductive lines, vias, and contacts, and isolation structures such as interlayer dielectrics and shallow trench isolation regions.

It is specifically contemplated that the conductor layers 106 may be formed from titanium nitride or other titanium-base materials, tantalum-based materials (e.g., TaN), or tungsten-based materials (e.g., $W_xN_y$), but it should be understood that any appropriate conductive material may be used instead. Other exemplary conductive materials may include, e.g., e.g., titanium, tantalum, tungsten, nickel, molybdenum, copper, platinum, silver, gold, ruthenium, iridium, rhenium, rhodium, cobalt, and alloys thereof.

It is specifically contemplated that the insulator layers 104 may be formed from such materials as silicon nitride (SiN), silicon oxynitride (SiON), silicon carbonide nitride (SiCN), or silicon oxide (SiOx), but it should be understood that any appropriate dielectric material may be used instead.

Figure 2:
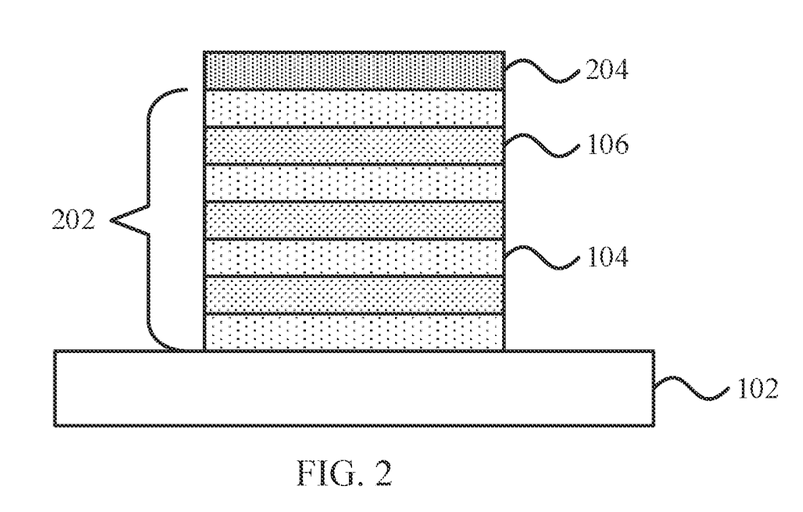
FIG. 2 is a cross-sectional view of a step in the formation of a device having a settable resistance, the stack of alternating insulator layers and conductor layers being patterned to form a device stack, in accordance with an embodiment of the present invention.

Referring now to FIG. 2, a cross-sectional view of a step in the formation of an RRAM cell is shown. The original layer stack 110 is patterned to form device stack 202. The device stack 202 includes exposed sidewalls of the dielectric layers 104 and the conductor layers 106.

Forming the device stack 202 from the layer stack 110 may be performed using any appropriate patterning process, such as by photolithography to form a mask 204, followed by one or more anisotropic etches. For example, reactive ion etching (RIE) is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
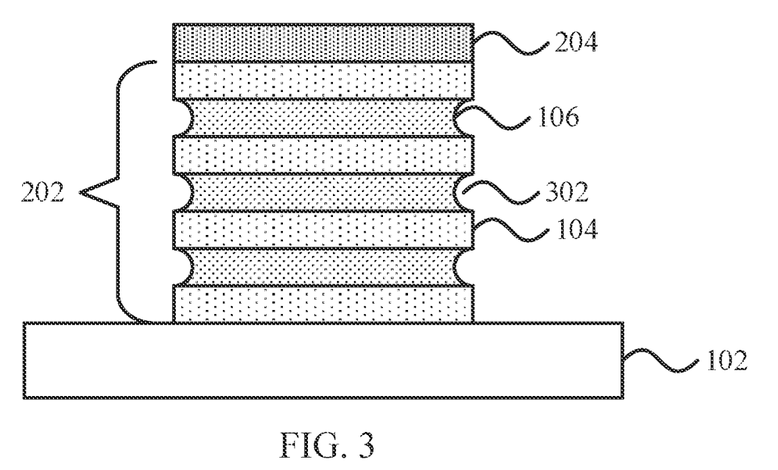
FIG. 3 is a cross-sectional view of a step in the formation of a device having a settable resistance, showing a an etch that creates divots in sidewalls of the conductor layers, in accordance with an embodiment of the present invention.

Referring now to FIG. 3, a cross-sectional view of a step in the formation of an RRAM cell is shown. A selective isotropic etch, such as a wet or dry chemical etch, is performed that targets the material of the conductor layers 106, leaving the dielectric layers 104 and the substrate 102 relatively undamaged. The etch creates concave divots 302 at the sidewalls of the conductor layers 106. As used herein, the term "selective" in reference to a material removal process denotes that the rate of material removal for a first material is greater than the rate of removal for at least another material of the structure to which the material removal process is being applied.

Figure 4:
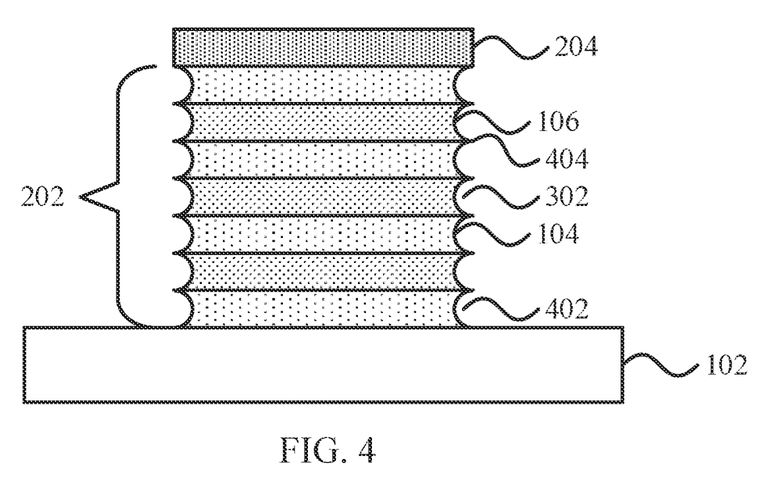
FIG. 4 is a cross-sectional view of a step in the formation of a device having a settable resistance, showing an etch that creates concave divots in sidewalls of the insulator layers to form tips at their interfaces with the conductor layers, in accordance with an embodiment of the present invention.

Referring now to FIG. 4, a cross-sectional view of a step in the formation of an RRAM cell is shown. A selective isotropic etch, such as a wet or dry chemical etch, is performed that targets the material of the insulator layers 104, leaving the conductor layers 106 relatively undamaged. The etch creates concave divots 402 at the sidewalls of the insulator layers 104. It should be understood that the etches of the insulator layers 104 and the conductor layers may 106, shown in FIGS. 3 and 4, may be performed in any appropriate order.

Each of these isotropic etches has a greater rate of material removal near the center of their respective layers, such that the concave divots 302 and 402 have a curved profile. At the boundaries between each pair of a dielectric layer 104 and a conductor layer 106, these curved profiles meet and create tips 404.

Figure 5:
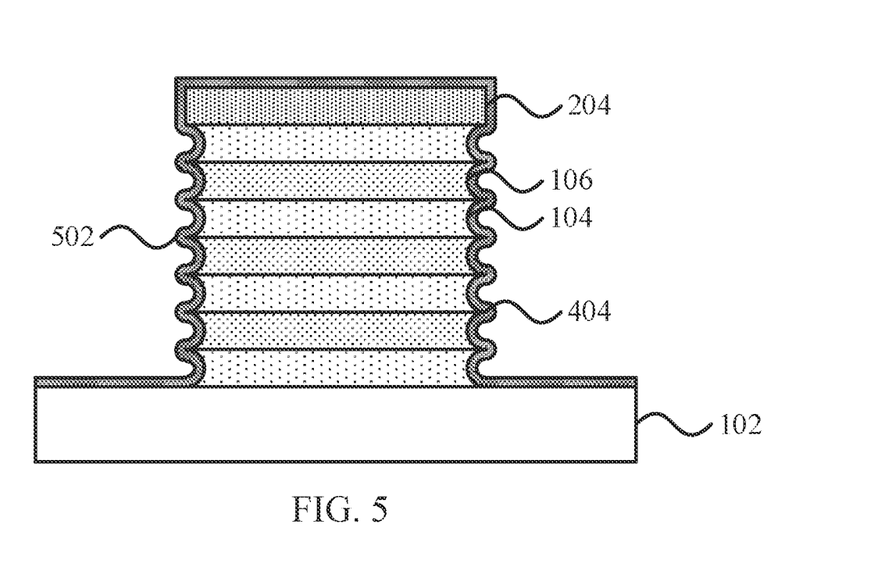
FIG. 5 is a cross-sectional view of a step in the formation of a device having a settable resistance, showing the formation of a dielectric layer over the device stack, in accordance with an embodiment of the present invention.

Referring now to FIG. 5, a cross-sectional view of a step in the formation of an RRAM cell is shown. A layer of dielectric material 502 is conformally deposited over the device stack 202, covering the tips 404, for example using a deposition process like chemical vapor deposition (CVD) or atomic layer deposition (ALD). The dielectric material 502 can have a thickness of about 1 nm to about 15 nm nanometers. Specific illustrative embodiments may have thicknesses that range between about 3 nm to about 9 nm. Specific illustrative embodiments may have thicknesses that range between about 4 nm to about 7 nm. In some embodiments, RRAM dielectric material 502 is a high-k dielectric material. In some embodiments, the dielectric material 502 is a transitional metal oxide. Examples of materials that can be suitable for RRAM cell dielectrics include nickel oxide, tantalum oxide, titanium oxide, hafnium oxide, tungsten oxide, zirconium oxide, aluminum oxide, and strontium titanium oxide.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use ALD, chemical precursors react with the surface of a material one at a time to deposit a thin film on the surface.

Figure 6:
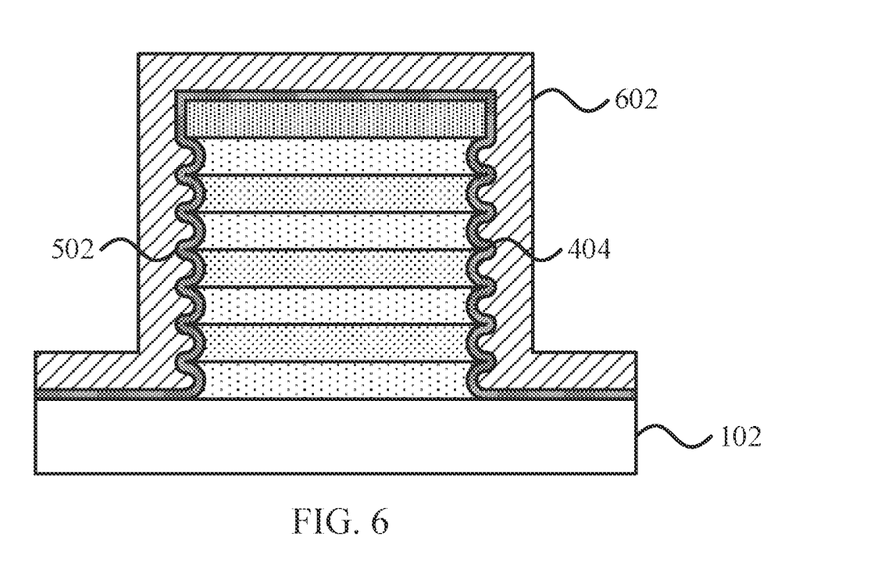
FIG. 6 is a cross-sectional view of a step in the formation of a device having a settable resistance, showing the formation of a top electrode over the device stack, in accordance with an embodiment of the present invention.

Referring now to FIG. 6, a cross-sectional view of a step in the formation of an RRAM cell is shown. A top electrode 602 is formed, for example by conformally depositing a conductive material over the dielectric material 502. The top electrode 602 may include an aluminum-containing alloy (for example, TiAl, TiAlC, TaAl, or TaAlC), titanium, tantalum, a combination including at least one of the foregoing, or a stack structure of metal nitride (for example, titanium nitride, tantalum nitride, or tungsten nitride). An illustrative stack structure may include titanium nitride and TiAlC. The top electrode 602 may further include tungsten, molybdenum, platinum, hafnium, copper, aluminum, gold, nickel, iridium or a combination including at least one of the foregoing.

During operation, the conductive layers 106 act as a first electrode, and the top electrode 602 acts as a second electrode. A current may be passed through the electrodes, across the dielectric material 502, to determine the resistance of the dielectric material.

Figure 7:
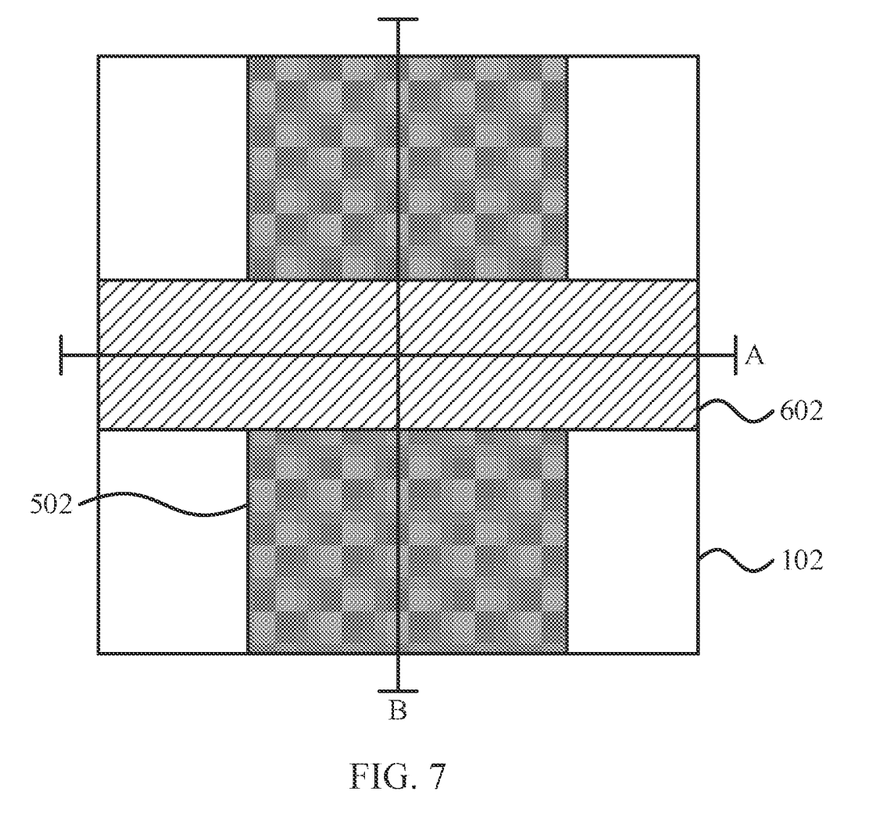
FIG. 7 is a top-down view a step in the formation of a device having a settable resistance, showing the positions of the device stack and the top electrode, in accordance with an embodiment of the present invention.

Referring now to FIG. 7, a top-down view of the RRAM cell of FIG. 6 is shown. This view indicates two cross-sections: Cross-section A identifies the location of the cross-sectional view shown in FIG. 6, while cross-section B identifies the location of a cross-sectional view that is referred to in the discussion below to illustrate different interconnect positions.

Figure 8:
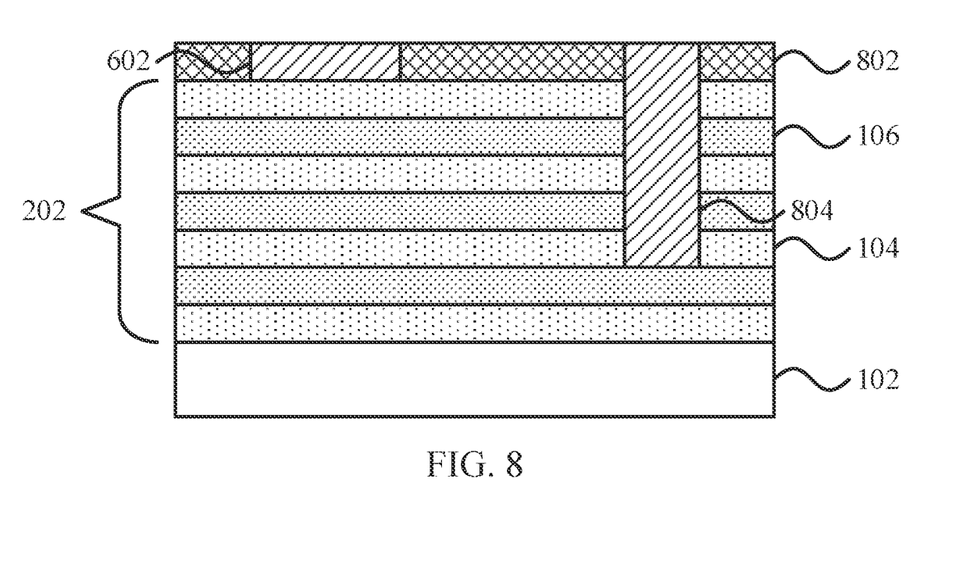
FIG. 8 is a cross-sectional view of a step in the formation of a device having a settable resistance, showing the formation of a wordline electrode through the device stack, in accordance with an embodiment of the present invention.

Referring now to FIG. 8, a cross-sectional view of a step in the formation of an RRAM cell is shown. This view is shown along cross-section B of FIG. 7. This view shows the top electrode 602 over the device stack 202. A word line electrode 804 is formed in a via that penetrates the device stack 202, making contact with the conductor layers 106. An interlayer dielectric 802 is formed over the device stack 202 and between the top electrode 602 and the word line electrode 804. In this example, the conductor layers 106 are all tied to a single word line electrode 804.

Figure 9:
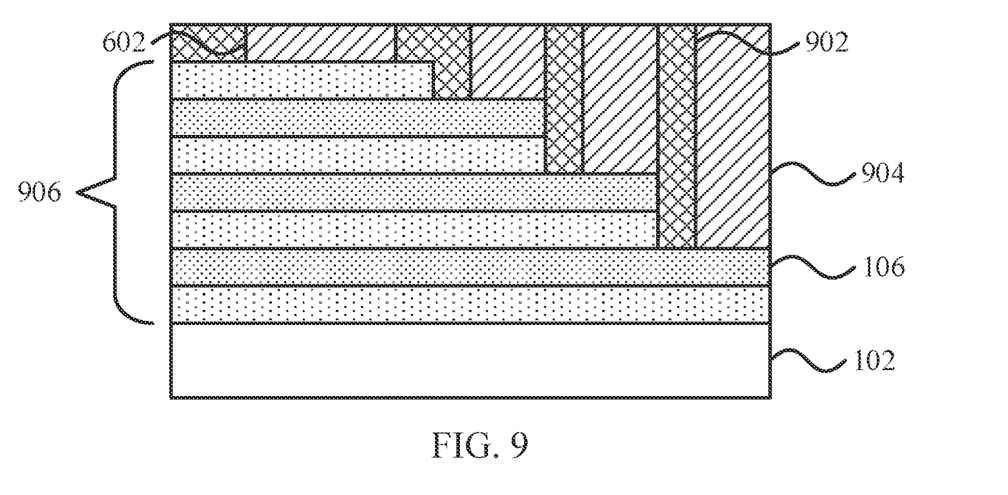
FIG. 9 is a cross-sectional view of a step in the formation of a device having a settable resistance, showing the formation of multiple wordlines electrodes to contact respective conductor layers in the device stack, in accordance with an embodiment of the present invention.

Referring now to FIG. 9, a cross-sectional view of a step in the formation of an alternative RRAM cell is shown. This view is also shown along cross-section B of FIG. 7. In this example, the device stack 202 is etched into a stepped stack 906, with each conductor layer 106 being etched to a different length. This may be performed by repeated masking and etching, where each conductor layer 106 and the corresponding dielectric layer 104 is selectively etched according to a respective mask. A new mask may then be formed before etching the next layer down, to protect a larger surface on the next layer.

Multiple different wordline electrodes 904 are formed to contact the different conductor layers 106. An interlayer dielectric 902 is formed around the top electrode 602 and the multiple wordline electrodes 904. In this manner, different conductor layers 106 can be addressed separately.

Figure 10:
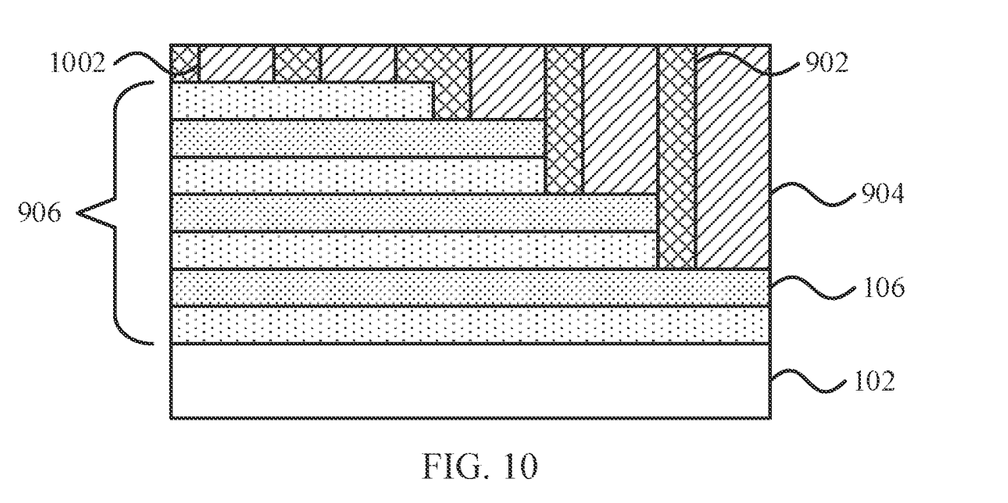
FIG. 10 is a cross-sectional view of a step in the formation of a device having a settable resistance, showing the formation of multiple wordline electrodes and multiple bitline electrodes, in accordance with an embodiment of the present invention.

Referring now to FIG. 10, a cross-sectional view of a step in the formation of an alternative RRAM cell is shown. This view is also shown along cross-section B of FIG. 7. In this example, as in the example of FIG. 9, multiple wordline electrodes 904 may be formed. Additionally, this example shows multiple bitline electrodes 1002, in lieu of the single top electrode 602. Any appropriate number of such bitline electrodes 1002, with each contacting the sidewalls of the conductor layers 106 by way of the dielectric material 502.

Figure 11:
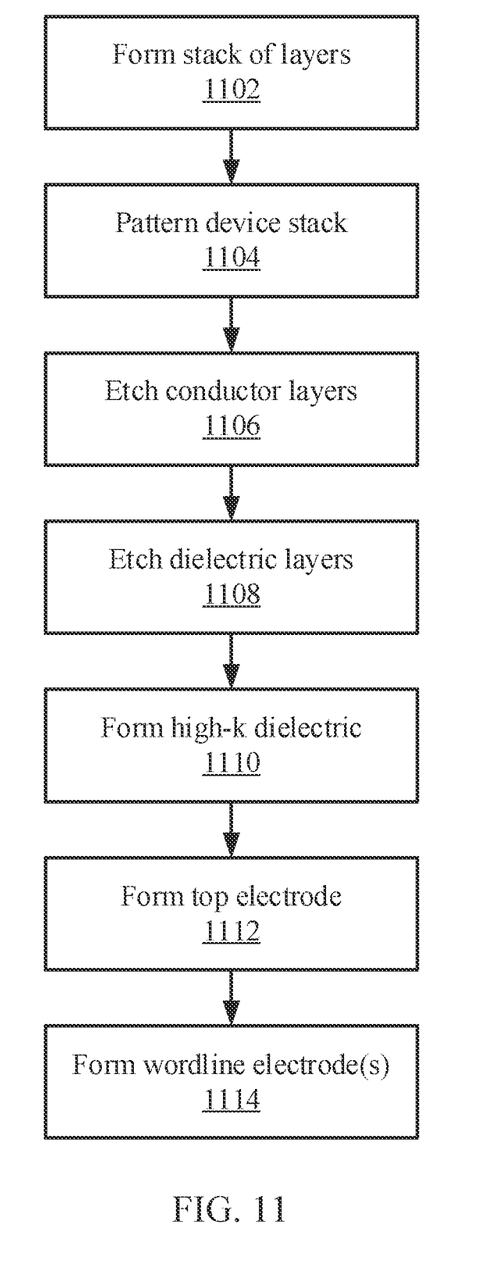
FIG. 11 is a block/flow diagram of a method of forming a device having a settable resistance, in accordance with an embodiment of the present invention.

Referring now to FIG. 11, a method of forming an RRAM cell is shown. Block 1102 forms a stack 110 of alternating dielectric layers 104 and conductor layers 106, for example by alternating deposition processes. Block 1104 then patterns the stack 110 to form device stack 202, for example using a photolithographic mask 204 and an anisotropic etch.

Block 1106 performs an isotropic etch that is selective to the conductor layers 106, forming divots 302 at the sidewalls of the conductor layers 106. Block 1108 performs an isotropic etch that is selective to the dielectric layers 104, forming divots 402 at the sidewalls of the dielectric layers 104. Blocks 1106 and 1108 can be performed in any order, for example with the etch of the dielectric layers 104 being performed before the etch of the conductor layers 106.

Block 1110 forms the dielectric layer 502 over the device stack 202, for example using a conformal deposition process to deposit a high-k dielectric material over the tips 404 that were formed by the formation of the divots 302 and 402. Top electrode(s) 602 may be formed over the device stack 202, providing an electrical connection to the conductor layers 106 through the dielectric layer 502. Block 1114 may form wordline electrode(s) 804 to provide direct electrical contact to one or more conductor layers 106 by forming a via through the device stack 202 and forming a conductive material therein.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIG. 1t will be understood that the spatially relative teams are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it ill also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

In some embodiments, RRAM cells may be used for neuromorphic computing in a neural network. An artificial neural network (ANN) is an information processing system that is inspired by biological nervous systems, such as the brain. One element of ANNs is the structure of the information processing system, which includes a large number of highly interconnected processing elements (called "neurons") working in parallel to solve specific problems. ANNs are furthermore trained using a set of training data, with learning that involves adjustments to weights that exist between the neurons. An ANN is configured for a specific application, such as pattern recognition or data classification, through such a learning process.

Figure 12:
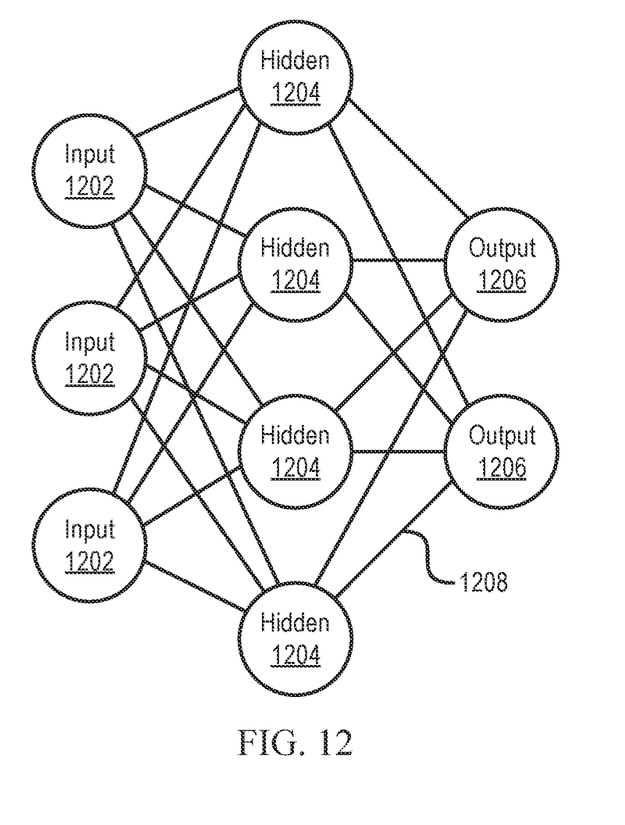
FIG. 12 is a diagram of an artificial neural network that can be implemented using devices having settable resistances, in accordance with an embodiment of the present invention.

Referring now to FIG. 12, a generalized diagram of a neural network is shown. Although a specific structure of an ANN is shown, having three layers and a set number of fully connected neurons, it should be understood that this is intended solely for the purpose of illustration. In practice, the present embodiments may take any appropriate form, including any number of layers and any pattern or patterns of connections therebetween.

ANNs demonstrate an ability to derive meaning from complicated or imprecise data and can be used to extract patterns and detect trends that are too complex to be detected by humans or other computer-based systems. The structure of a neural network is known generally to have input neurons 1202 that provide information to one or more "hidden" neurons 1204. Connections 1208 between the input neurons 1202 and hidden neurons 1204 are weighted, and these weighted inputs are then processed by the hidden neurons 1204 according to some function in the hidden neurons 1204. These weights 1208 may be implemented using the settable resistance devices described above.

There can be any number of layers of hidden neurons 1204, and as well as neurons that perform different functions. There exist different neural network structures as well, such as a convolutional neural network, a maxout network, etc., which may vary according to the structure and function of the hidden layers, as well as the pattern of weights between the layers. The individual layers may perform particular functions, and may include convolutional layers, pooling layers, fully connected layers, softmax layers, or any other appropriate type of neural network layer. Finally, a set of output neurons 1206 accepts and processes weighted input from the last set of hidden neurons 1204.

This represents a "feed-forward" computation, where information propagates from input neurons 1202 to the output neurons 1206. Upon completion of a feed-forward computation, the output is compared to a desired output available from training data. The error relative to the training data is then processed in "backpropagation" computation, where the hidden neurons 1204 and input neurons 1202 receive information regarding the error propagating backward from the output neurons 1206. Once the backward error propagation has been completed, weight updates are performed, with the weighted connections 1208 being updated to account for the received error. It should be noted that the three modes of operation, feed forward, back propagation, and weight update, do not overlap with one another. This represents just one variety of ANN computation, and that any appropriate form of computation may be used instead.

To train an ANN, training data can be divided into a training set and a testing set. The training data includes pairs of an input and a known output. During training, the inputs of the training set are fed into the ANN using feed-forward propagation. After each input, the output of the ANN is compared to the respective known output. Discrepancies between the output of the ANN and the known output that is associated with that particular input are used to generate an error value, which may be backpropagated through the ANN, after which the weight values of the ANN may be updated. This process continues until the pairs in the training set are exhausted.

After the training has been completed, the ANN may be tested against the testing set, to ensure that the training has not resulted in overfitting. If the ANN can generalize to new inputs, beyond those which it was already trained on, then it is ready for use. If the ANN does not accurately reproduce the known outputs of the testing set, then additional training data may be needed, or hyperparameters of the ANN may need to be adjusted.

ANNs may be implemented in hardware. For example, each weight 1208 may be characterized as a weight value that is stored as a resistive value of a resistive processing unit (RPUs), generating a predictable current output when an input voltage is applied in accordance with a settable resistance.

Figure 13:
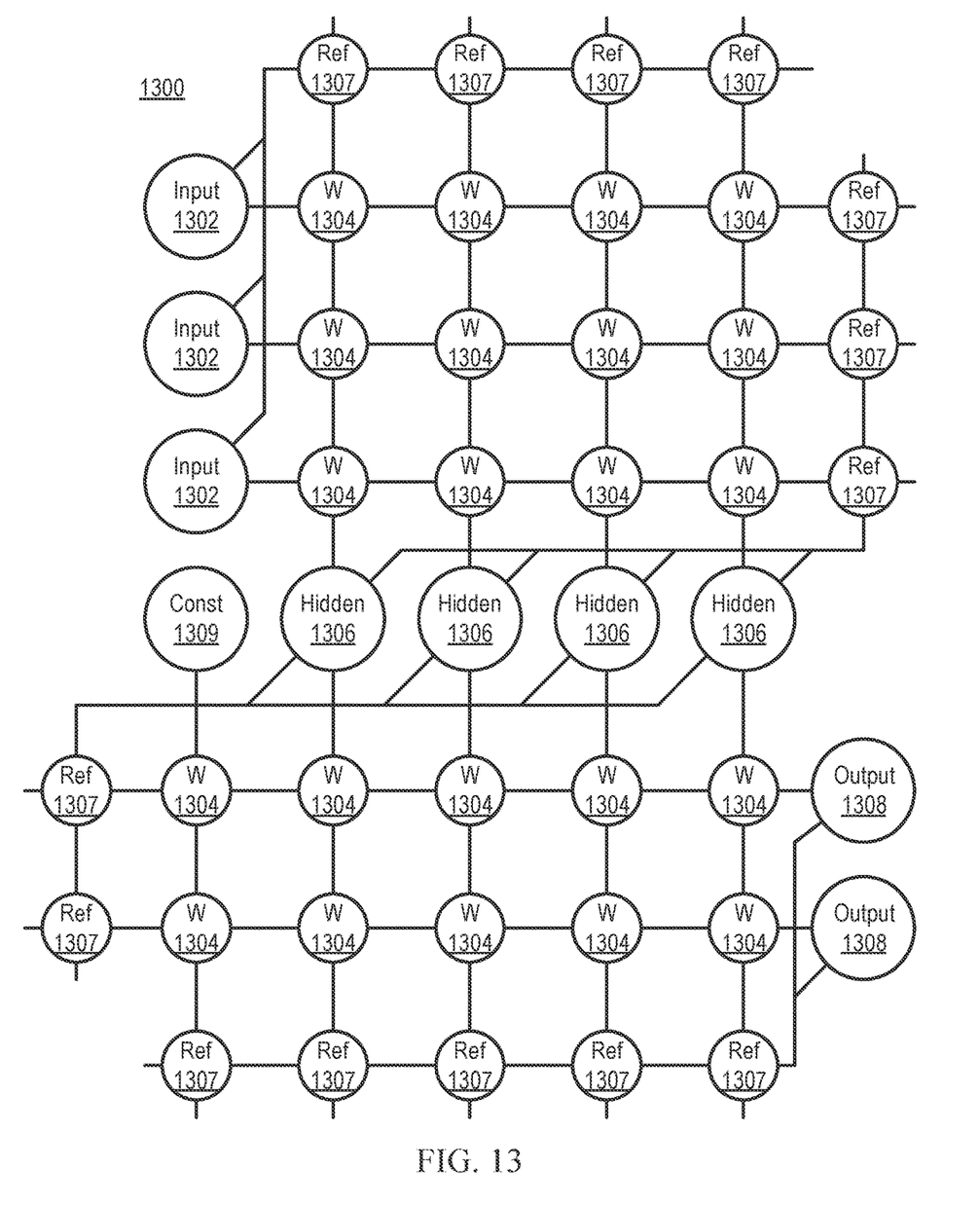
FIG. 13 is a diagram of a neuromorphic computing device that can implement an artificial neural network using settable resistance cells, in accordance with an embodiment of the present invention.

Referring now to FIG. 13, a hardware architecture 1300 for an ANN is shown. It should be understood that the present architecture is purely exemplary, and that other architectures or types of neural network can be used instead. The hardware embodiment described herein is included with the intent of illustrating general principles of neural network computation at a high level of generality and should not be construed as limiting in any way.

Furthermore, the layers of neurons described below and the weights connecting them are described in a general manner and can be replaced by any type of neural network layers with any appropriate degree or type of interconnectivity. For example, layers can include convolutional layers, pooling layers, fully connected layers, softmax layers, or any other appropriate type of neural network layer. Furthermore, layers can be added or removed as needed, and the weights described herein can be replaced with more complicated forms of interconnection.

During feed-forward operation, input neurons 1302 each provide an input voltage in parallel to a respective row of weights 1304. As noted above, the weights 1304 can be implemented in hardware, for example using the settable resistance cells described above. In the hardware embodiment described herein, the weights 1304 each have a settable resistance value, such that a current output flows from the weight 1304 to a respective hidden neuron 1306. The current output by the weight 1304 therefore represents a weighted input to the hidden neuron 1306.

Following the hardware embodiment, the current output by a given weight 1304 is determined as $$I = \frac{V}{r},$$

where V is the input voltage from the input neuron 1302 and r is the set resistance of the weight 1304. The currents from each of the weights 1304 add column-wise and flow to a hidden neuron 1306.

A set of reference weights 1307 have a fixed resistance and combine their outputs into a reference current that is provided to each of the hidden neurons 1306. Because conductance values can only be positive numbers, some reference conductance is needed to encode both positive and negative values in the matrix. The currents produced by the weights 1304 are continuously valued and positive, and therefore the reference weights 1307 are used to provide a reference current, above which currents are considered to have positive values and below which currents are considered to have negative values. As an alternative to using the reference weights 1307, another embodiment can use separate arrays of weights 1304 to capture negative values.

The hidden neurons 1306 use the currents from the array of weights 1304 and the reference weights 1307 to perform some calculation. This calculation may be, for example, any appropriate activation function, and may be implemented in hardware using appropriate circuitry, or in software.

The hidden neurons 1306 then output a voltage of their own, based on the activation function, to another array of weights 1304. This array performs its weighting calculations in the same way, with a column of weights 1304 receiving a voltage from their respective hidden neuron 1306 to produce a weighted current output that adds row-wise and is provided to the output neuron 1308.

It should be understood that any number of these stages can be implemented, by interposing additional layers of arrays and hidden neurons 1306. It should also be noted that some neurons can be constant neurons 1309, which provide a constant output to the array. The constant neurons 1309 can be present among the input neurons 1302 and/or hidden neurons 1306 and are only used during feed-forward operation.

During back propagation, the output neurons 1308 provide a voltage back across the array of weights 1304. The output layer compares the generated network response to training data and computes an error. The error is applied to the array as a voltage pulse, where the height and/or duration of the pulse is modulated proportional to the error value. In this example, a row of weights 1304 receives a voltage from a respective output neuron 1308 in parallel and converts that voltage into a current which adds column-wise to provide an input to hidden neurons 1306. The hidden neurons 1306 combine the weighted feedback signal with a derivative of its feed-forward calculation and stores an error value before outputting a feedback signal voltage to its respective column of weights 1304. This back propagation travels through the entire network 1300 until all hidden neurons 1306 and the input neurons 1302 have stored an error value.

The weight update process will depend on how the weights 1304 are implemented. For settable resistances that include phase change materials, the input neurons 1302 and hidden neurons 1306 may apply a first weight update voltage forward and the output neurons 1308 and hidden neurons 1306 may apply a second weight update voltage backward through the network 1300. The combinations of these voltages may create a state change within each weight 1304, causing the weight 1304 to take on a new resistance value, for example by raising a temperature of the weight 1304 above a threshold and thus changing its resistance. In this manner the weights 1304 can be trained to adapt the neural network 1300 to errors in its processing.

Having described preferred embodiments of nanotip filament confinement (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a settable resistance device, comprising:
    isotropically etching a stack of layers, the stack of layers having an insulator layer in contact with a conductor layer, to selectively form divots in exposed sidewalls of the conductor layer;
    isotropically etching the stack of layers to selectively form divots in exposed sidewalls of the insulator layer, thereby forming a tip at an interface between the insulator layer and the conductor layer;
    forming a dielectric layer over the stack of layers to cover the tip; and
    forming an electrode over the dielectric layer, such that the dielectric layer is between the electrode and the tip.

2. The method of claim 1, wherein forming the dielectric layer includes conformally depositing hafnium oxide.

3. The method of claim 1, wherein forming the electrode includes conformally depositing a conductive material that fills the divots.

4. The method of claim 1, wherein the stack of layers includes alternating conductor layers and insulator layers.

5. The method of claim 4, further comprising forming a stepped pattern in the alternating conductor layers.

6. The method of claim 5, further comprising forming a plurality of wordline contacts, each of the plurality of contacts contacting a respective conductor layer in the stack of layers.

7. The method of claim 4, further comprising a wordline contact in a via that penetrates the stack of layers and contacts each of the conductor layers.

8. The method of claim 1, wherein the stack layers includes an etch mask over the conductor layer and the insulator layer, such that the dielectric layer is formed over the etch mask.

9. A settable resistance cell, comprising:
    a stack of layers that includes an insulator layer in contact with a conductor layer, each having concave sidewall surfaces that meet at an interface between the insulator layer and the conductor layer to form a tip to focus electrical field strength;
    a dielectric layer formed over the stack of layers that covers the tip; and
    an electrode formed over the dielectric layer, such that the dielectric layer is positioned between the electrode and the tip.

10. The settable resistance cell of claim 9, wherein the stack of layers includes a plurality of alternating conductor layers and insulator layers.

11. The settable resistance cell of claim 10, wherein the alternating conductor layers and insulator layers have a stepped pattern.

12. The settable resistance cell of claim 11, further comprising a plurality of wordline contacts, each of the plurality of contacts contacting a respective conductor layer in the stack of layers.

13. The settable resistance cell of claim 10, further comprising a wordline contact in a via that penetrates the stack of layers and contacts each of the conductor layers.

14. The settable resistance cell of claim 9, further comprising an etch mask layer on the stack of layers, positioned between the stack of layers and the dielectric layer.

15. The settable resistance cell of claim 9, wherein the dielectric layer is formed from hafnium oxide.

16. A neuromorphic computing device, comprising:
    an array of settable resistance cells, each settable resistance cell including:
        a stack of layers that includes an insulator layer in contact with a conductor layer, each having concave sidewall surfaces that meet at an interface between the insulator layer and the conductor layer to form a tip to focus electrical field strength;
        a dielectric layer formed over the stack of layers that covers the tip; and
        an electrode formed over the dielectric layer, such that the dielectric layer is positioned between the electrode and the tip.

17. The neuromorphic computing device of claim 16, wherein the stack of layers of each settable resistance cell includes a plurality of alternating conductor layers and insulator layers.

18. The neuromorphic computing device of claim 17, wherein each settable resistance cell further includes a wordline contact in a via that penetrates the stack of layers and contacts each of the conductor layers.

19. The neuromorphic computing device of claim 16, wherein each settable resistance cell further includes an etch mask layer on the stack of layers, positioned between the stack of layers and the dielectric layer.

20. The neuromorphic computing device of claim 16, wherein each dielectric layer is formed from hafnium oxide.

* * * * *